(12) United States Patent
Zhang et al.

(10) Patent No.: US 10,209,573 B2
(45) Date of Patent: Feb. 19, 2019

(54) UV CURING MASK PLATE AND A FABRICATING METHOD THEREOF AND A DISPLAY DEVICE

(71) Applicants: Boe Technology Group Co., Ltd., Beijing (CN); Beijing Boe Display Technology Co., Ltd., Beijing (CN)

(72) Inventors: Xiaoxiang Zhang, Beijing (CN); Zheng Liu, Beijing (CN); Zongjie Guo, Beijing (CN); Zhichao Zhang, Beijing (CN); Mingxuan Liu, Beijing (CN); Xi Chen, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 153 days.

(21) Appl. No.: 14/744,392

(22) Filed: Jun. 19, 2015

(65) Prior Publication Data
US 2016/0223901 A1    Aug. 4, 2016

(30) Foreign Application Priority Data

Feb. 2, 2015    (CN) .......................... 2015 1 0053834

(51) Int. Cl.
*G03F 1/42*    (2012.01)
*G02F 1/1339*    (2006.01)
(Continued)

(52) U.S. Cl.
CPC .............. *G02F 1/1339* (2013.01); *G03F 1/42* (2013.01); *G03F 1/54* (2013.01); *G02F 1/1341* (2013.01); *G02F 2001/133354* (2013.01)

(58) Field of Classification Search
CPC . G03F 7/0007; G03F 1/50; G03F 1/54; G03F 1/42; G02B 5/201; G02B 5/223;
(Continued)

(56) References Cited

U.S. PATENT DOCUMENTS 5,958,628 A  *  9/1999  Balz .......................... G03F 1/68
                                                                216/94
2003/0156246 A1 * 8/2003  Park ...................... G02F 1/1339
                                                                349/187
(Continued)

FOREIGN PATENT DOCUMENTS

CN        101995762            3/2011
CN        102520590 A           6/2012
(Continued)

OTHER PUBLICATIONS

Computer-generated translation of CN 104122700 (Oct. 2014).*
(Continued)

*Primary Examiner* — John A McPherson
(74) *Attorney, Agent, or Firm* — Calfee, Halter & Griswold LLP

(57) ABSTRACT

An UV curing mask plate, comprising: a mask layer, wherein: the mask layer is arranged on the substrate, and has a position corresponding to alignment marks, selection marks and an area not covered by the sealing frame glue to be cured; the material of the mask layer is a material with the function of blocking UV light.

17 Claims, 4 Drawing Sheets

(51) Int. Cl.
*G03F 1/54* (2012.01)
*G02F 1/1341* (2006.01)
*G02F 1/1333* (2006.01)

(58) Field of Classification Search
CPC ......... G02F 1/133514; G02F 1/133516; G02F 1/1339
USPC ....................................................... 430/5, 7
See application file for complete search history.

(56) References Cited

U.S. PATENT DOCUMENTS

| | | | |
|---|---|---|---|
| 2006/0043318 A1* | 3/2006 | Kodera | G02F 1/1339 250/504 R |
| 2009/0233188 A1 | 9/2009 | Amano et al. | |
| 2013/0078552 A1* | 3/2013 | Lee | G03F 1/42 430/5 |
| 2013/0316269 A1* | 11/2013 | Ye | G03F 1/00 430/5 |
| 2016/0342082 A1* | 11/2016 | Fu | G03F 7/0007 |

FOREIGN PATENT DOCUMENTS

| | | | |
|---|---|---|---|
| CN | 103235450 | | 8/2013 |
| CN | 103246154 | | 8/2013 |
| CN | 103969944 A | * | 8/2014 |
| JP | 2014-060317 | | 4/2014 |
| JP | 104122700 | | 10/2014 |

OTHER PUBLICATIONS

Office Action from China Application No. 201510053834.3 dated Jan. 16, 2017.

Office action from Chinese Application No. 201510053834.3 dated Aug. 17, 2016.

Office action from Chinese Application No. 201510053834.3 dated Mar. 31, 2016.

Fourth Office Action for Chinese Patent Application No. 201510053834.3 dated Jun. 5, 2017.

Fifth Office Action for Chinese Patent Application No. 201510053834.3 dated Sep. 29, 2017.

* cited by examiner

UV CURING MASK PLATE AND A FABRICATING METHOD THEREOF AND A DISPLAY DEVICE

RELATED APPLICATIONS

The present application claims the benefit of Chinese Patent Application No. 201510053834.3, filed on Feb. 2, 2015, the entire disclosure of which is incorporated herein by reference.

FIELD OF THE INVENTION

This disclosure relates to the field of display technology, particularly to an UV curing mask plate as well as a fabricating method thereof and a display device.

BACKGROUND OF THE INVENTION

In the box forming process of the Thin Film Transistor-Liquid Crystal Display (TFT-LCD) panel, in order to prevent the liquid crystals between the array substrate and the color film substrate from flowing out, it is required to coat the sealing frame glue around the edges of the array substrate and the color film substrate, thereby forming a liquid crystal box and achieving the aim of liquid crystal light-guiding and display. Thus it requires the sealing frame glue around the liquid crystal panel to be cured within the shortest time, so as to prevent the liquid crystals from being contaminated by the uncured sealing frame glue, which may influence the quality of the product. The existing sealing frame glue curing comprises UV curing and thermal curing, in UV curing it is required to use UV light to irradiate selectively. Generally an UV mask that corresponds to the corresponding product is fabricated specially to cure the sealing frame glue, however, the design of the UV mask needs a relatively long time and the cost is also relatively high.

In order to save production time and reduce the cost, the following method is generally used in the prior art to form the mask plate used in sealing frame glue curing: firstly, performing slicing exposure and etching processes to the substrate using the mask plate with the function of blocking UV light, so as to form a mask layer corresponding to the UV alignment sign; then depositing on the substrate a protective layer for protecting the mask layer; subsequently, depositing a metal film, performing exposure using a particular exposure device to form an UV mask pattern corresponding to the area that needs to be cured in the sealing frame glue film, and obtaining a corresponding UV mask pattern through etching. However, such a method of forming the mask plate in the prior art requires filming, exposure and etching processes many times, the procedure is relatively complex, moreover, there are multilayer films in the mask plate formed, there is also a relatively large amount of production materials used, and correspondingly the cost is also relatively high.

SUMMARY OF THE DISCLOSURE

The embodiment of this disclosure provides an UV curing mask plate as well as a fabricating method thereof and a display device, and solves the problem that the fabrication of the existing UV curing mask plate required in sealing frame glue curing needs to perform filming, exposure and etching processes many times, which reduces the production cost, reduces the process flow, and reduces the complexity.

In order to achieve the above object, the embodiments of this disclosure adopt the following technical solutions:

A first aspect provides an UV curing mask plate, the UV curing mask plate comprising a substrate, a panel of a film to be cured provided with alignment marks and selection marks, characterized in that the UV curing mask plate further comprises: a mask layer, wherein:

the mask layer is arranged on the substrate, and on a position corresponding to the alignment marks, the selection marks and the area not covered by the sealing frame glue to be cured;

the material of the mask layer is a material with the function of blocking UV light.

Optionally, the material of the mask layer comprises a metal material.

Optionally, the metal material comprises: at least one of molybdenum, aluminum, copper, tungsten.

Optionally, the thickness of the mask layer is 2000~4000 Å.

A second aspect provides a method of fabricating an UV curing mask plate, characterized in that, the method comprises:

providing a substrate;

forming a pattern of the mask layer on the substrate through one patterning process;

wherein the material of the mask layer is a material with the function of blocking UV light.

Optionally, the panel of a film to be cured is provided with alignment marks and selection marks, said forming a pattern of the mask layer on the substrate through one patterning process comprises:

forming a mask layer material film on the substrate;

processing the mask layer material film through one patterning process so as to form a first mask layer pattern; wherein the first mask layer pattern is a pattern on the mask layer corresponding to the alignment marks and the selection marks;

processing the first mask layer pattern so as to form a mask layer pattern corresponding to the area not covered by the film to be cured.

Optionally, said processing the mask layer material film through one patterning process so as to form a first mask layer pattern comprises:

coating photoresist on the substrate on which the mask layer material film is formed;

exposing the photoresist using the mask plate, then developing the exposed photoresist, forming a photoresist complete reservation area and a photoresist complete removal area after the development; wherein the photoresist complete reservation area corresponds to the areas of the alignment marks and selection marks, other areas are the photoresist complete removal area;

removing the mask layer material film located in the photoresist complete removal area.

Optionally, said processing the first mask layer pattern so as to form a mask layer pattern corresponding to the area not covered by the film to be cured comprises:

processing the first mask layer pattern through laser scanning process using a laser scanning device, so as to form a mask layer pattern corresponding to the area not covered by the film to be cured.

Optionally, said processing the first mask layer pattern so as to form a mask layer pattern corresponding to the area not covered by the film to be cured comprises:

processing the first mask layer pattern using the mask plate so as to form an UV pattern fabricating area;

processing the UV pattern fabricating area through laser scanning process using a laser scanning device, so as to form a mask layer pattern corresponding to the area not covered by the film to be cured.

A third aspect provides a display device, the film to be cured in the display device is cured using an UV curing mask plate as stated in the first aspect.

The UV curing mask plate as well as the fabricating method thereof and the display device provided by the embodiments of this disclosure form a mask layer pattern on the substrate by using a patterning process, meanwhile, the formed UV curing mask plate only comprises a substrate and a mask layer, and the material of the mask layer is a material with the function of blocking UV light, in this way, the fabrication of the UV curing mask plate only needs to perform filming, exposure and etching processes once, it solves the problem that the fabrication of the UV mask plate used in the existing sealing frame glue curing process needs to perform filming, exposure and etching processes many times, which reduces the production cost, reduces the process flow, and reduces the complexity.

BRIEF DESCRIPTION OF THE DRAWINGS

In order to explain the technical solutions in the embodiments of this disclosure or the prior art more clearly, the drawings to be used in the embodiments or the description of the prior art will be introduced briefly in the following, apparently, the drawings described below are only some embodiments of this disclosure, the ordinary skilled person in the art can also obtain other drawings based on these drawings without paying any creative work.

DETAILED DESCRIPTION OF THE INVENTION

Next, the technical solutions in the embodiments of this disclosure will be described clearly and completely in conjunction with the drawings in the embodiments of this disclosure, apparently, the described embodiments are only part rather than all of the embodiments of this disclosure. All the other embodiments obtained by the ordinary skilled person in the art based on the embodiments in this disclosure without paying any creative work belong to the protection scope of this disclosure.

The specification and drawings include the following reference signs: 1—substrate; 2—mask layer; 3—area in the mask layer corresponding to the alignment sign; 4—area in the mask layer corresponding to the selection sign; 5—area in the mask layer corresponding to the area not covered by the sealing frame glue to be cured; 21—mask layer material film; 22—photoresist.

Figure 1:
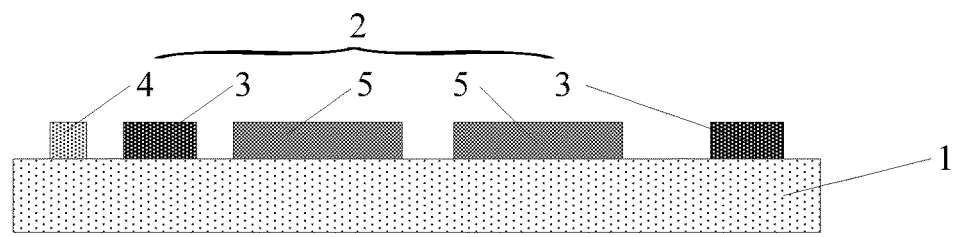
FIG. 1 is a structural schematic view of an UV curing mask plate provided by an embodiment of this disclosure.
Figure 2:
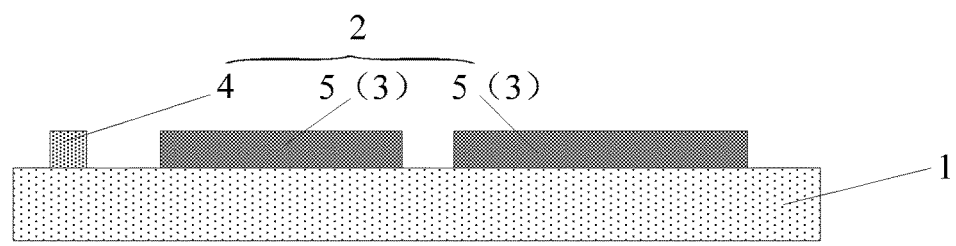
FIG. 2 is a structural schematic view of another UV curing mask plate provided by an embodiment of this disclosure.

The embodiment of this disclosure provides an UV curing mask plate, the UV curing mask plate is applied in the sealing frame glue curing process, as shown in FIG. 1 and FIG. 2, the UV curing mask plate comprises: a substrate 1 and a mask layer 2, a panel 1 of a film to be cured provided with alignment marks and selection marks, wherein:

The mask layer 2 is arranged on the substrate 1, and on a position corresponding to the alignment marks, the selection marks and the area not covered by the film to be cured.

The material of the mask layer 2 is a material with the function of blocking UV light.

Wherein, as shown in FIG. 1 and FIG. 2, the mask layer 2 comprises: an area 3 corresponding to the alignment marks, an area 3 corresponding to the selection marks and an area corresponding to the area not covered by the film to be cured. Exemplarily in this embodiment, the film to be cured may be the sealing frame glue to be cured.

Figure 3:
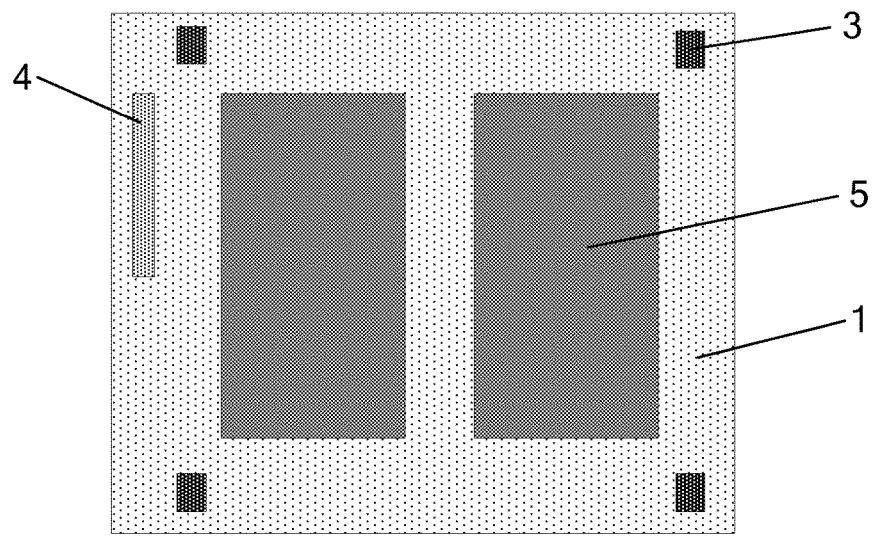
FIG. 3 is a vertical structural schematic view of a further UV curing mask plate provided by an embodiment of this disclosure.

Specifically, as shown in FIG. 1, the area covered by the sealing frame glue to be cured is not on the same line as the alignment marks in the UV curing mask plate to be used. Therefore, the UV curing mask plate as shown in FIG. 1 can be used for curing the sealing frame glue. Wherein, as shown in FIG. 3, it is a vertical structural schematic view of the UV curing mask plate in FIG. 1.

Figure 4:
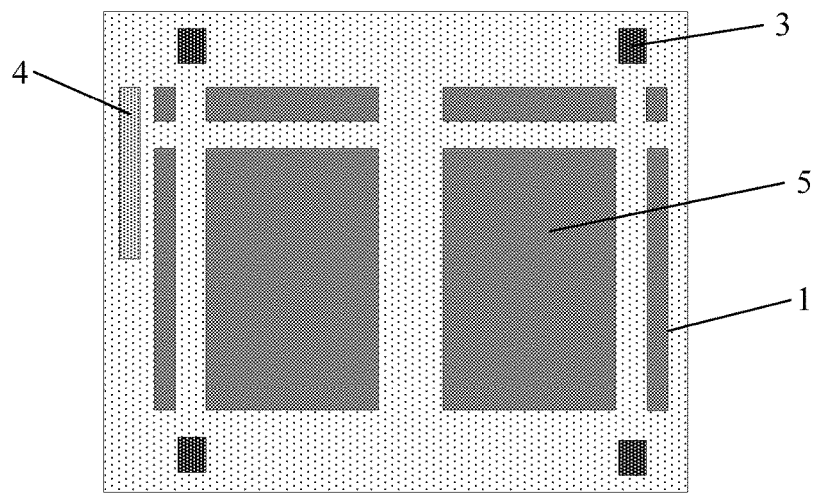
FIG. 4 is a vertical structural schematic view of an UV curing mask plate provided by an embodiment of this disclosure.

Optionally, as shown in FIG. 2, here the area covered by the sealing frame glue to be cured is on the same line as the alignment marks in the UV curing mask plate to be used, thus the UV curing mask plate as shown in FIG. 2 needs to be used to cure the sealing frame glue. Wherein, as shown in FIG. 4, it is a vertical structural schematic view of the UV curing mask plate in FIG. 2.

The UV curing mask plate provided by the embodiment of this disclosure forms a mask layer pattern on the substrate by using a patterning process, meanwhile, the formed UV curing mask plate only comprises a substrate and a mask layer, and the material of the mask layer is a material with the function of blocking UV light, in this way, the fabrication of the UV curing mask plate only needs to perform filming, exposure and etching processes once, it solves the problem that the fabrication of the UV mask plate used in the existing sealing frame glue curing process needs to perform filming, exposure and etching processes many times, which reduces the production cost, reduces the process flow, and reduces the complexity.

Further, the material of the mask layer 2 comprises a metal material.

The metal material comprises: at least one of molybdenum, aluminum, copper, tungsten.

Wherein, in this embodiment, the metals of molybdenum, aluminum, copper, tungsten with a relatively large conductivity and magnetic conductivity are preferably used as the material of the mask layer, which can ensure the shielding effect to the UV light better. Certainly, the above metal materials are only examples, it is not defined that only these materials can be used, the metal materials that can achieve the shielding effect to the UV light in the prior art are all applicable.

The thickness of the mask layer 2 is 2000~4000 Å.

Wherein, exemplarily, the thickness of the mask layer generally used is 2000 Å. The thickness of the mask layer used in the embodiment of this disclosure is 2000~4000 Å, which can avoid, while shielding the UV light, that the thickness of the formed UV curing mask plate is too large and the space occupied is too large. Meanwhile, the cost can be saved.

Specifically, the UV curing mask plate used in the sealing frame glue curing in the prior art needs a substrate, a protective layer and a mask layer, while the UV curing mask plate provided in the embodiment of this disclosure only needs a substrate and a mask layer; compared with the prior art, the UV curing mask plate in this disclosure needs no additional fabricating protective layer, certainly, the fabricating process is also greatly simplified, the cost is saved greatly, and the process complexity of forming the UV curing mask plate is reduced.

The UV curing mask plate provided by the embodiment of this disclosure forms a mask layer pattern on the substrate by using a patterning process, meanwhile, the formed UV curing mask plate only comprises a substrate and a mask layer, and the material of the mask layer is a material with the function of blocking UV light, in this way, the fabrication of the UV curing mask plate only needs to perform filming, exposure and etching processes once, it solves the problem that the fabrication of the UV mask plate used in the existing sealing frame glue curing process needs to perform filming, exposure and etching processes many times, which reduces the production cost, reduces the process flow, and reduces the complexity. Thereby, it can save time and improve production efficiency.

Figure 5:
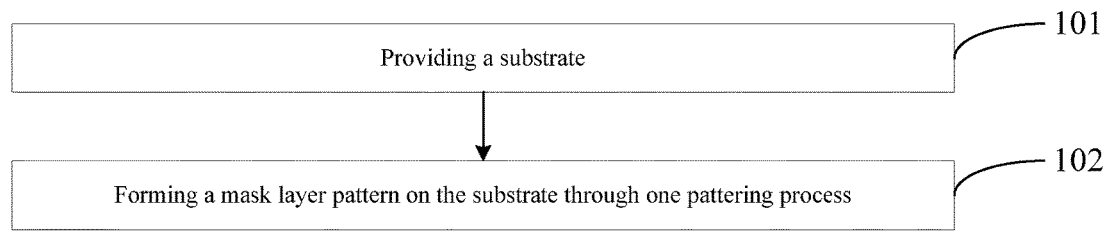
FIG. 5 is a flow chart of a method of fabricating an UV curing mask plate provided by an embodiment of this disclosure.

The embodiment of this disclosure provides a method of fabricating an UV curing mask plate, the method is applied in the sealing frame glue curing process, as shown in FIG. 5, this embodiment makes explanation by taking the film to be cure as the sealing frame glue to be cured, the method comprises the steps of:

101. Providing a substrate.

Wherein, the substrate may be a transparent substrate such as a glass substrate, a quartz substrate, or a plastic substrate.

102. Forming a pattern of the mask layer on the substrate through one patterning process.

Wherein the material of the mask layer is a material with the function of blocking the UV light.

The so-called "patterning process" is a process of forming the film as a layer comprising at least one pattern; and the patterning process generally comprises: forming a film material on the film, coating photoresist, exposing the photoresist using the mask plate, removing the photoresist that needs to be removed using developer, then etching the film portion not covered by the photoresist, finally peeling off the remainder photoresist. Whereas in all the embodiments of this disclosure, "a patterning process" means that the masking and exposure processes contained in the patterning process are only performed once.

Figure 6:
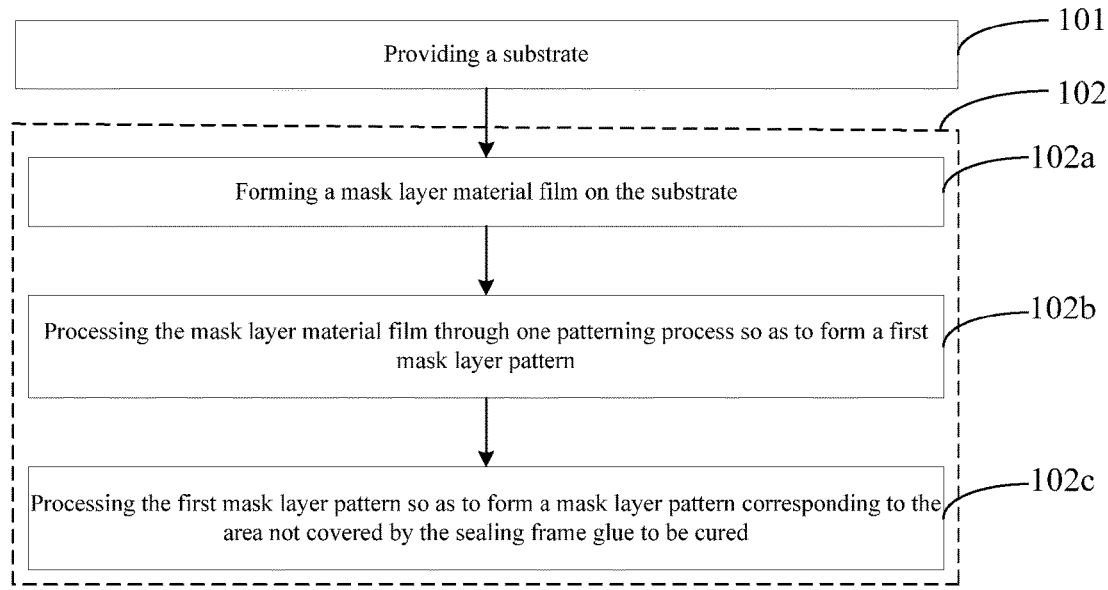
FIG. 6 is a flow chart of a method of fabricating another UV curing mask plate provided by an embodiment of this disclosure.
Figure 7:
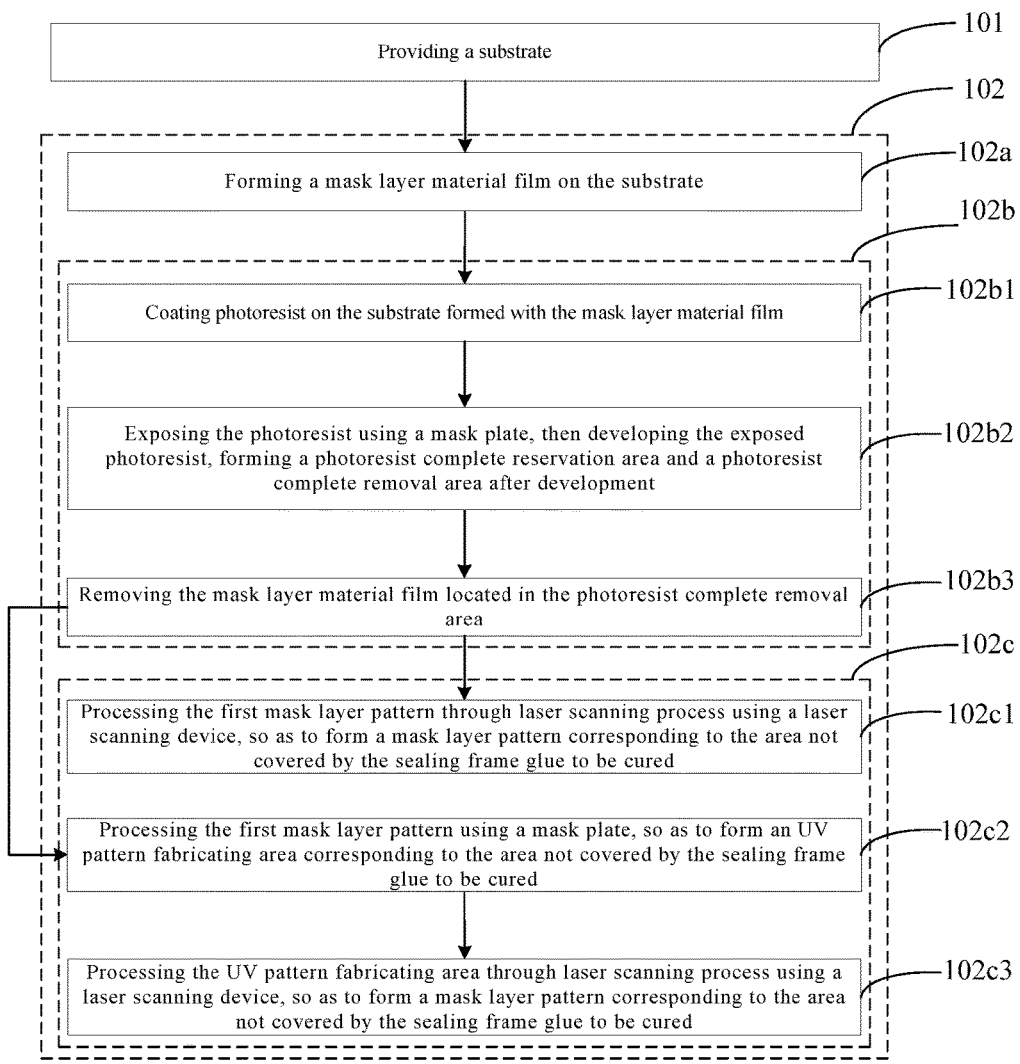
FIG. 7 is a flow chart of a method of fabricating a further UV curing mask plate provided by an embodiment of this disclosure.

The embodiment of this disclosure provides a method of fabricating an UV curing mask plate, the method is applied in the sealing frame glue curing, specifically, as shown in FIG. 6 and FIG. 7, the step 102 of forming a pattern of a mask layer through one patterning process specifically may comprise the steps of:

102a. Forming a mask layer material film on the substrate.

Specifically, a mask layer material film with a thickness of 2000 Å to 4000 Å can be deposited on the substrate such as a glass substrate using the method of magnetron sputtering, wherein the mask layer material film may be a metal material; the metal material may generally use metals such as molybdenum, aluminum, copper, tungsten.

102b. Processing the mask layer material film through one patterning process, so as to form a first mask layer pattern.

Wherein the first mask layer pattern is a pattern on the mask layer corresponding to the alignment marks and the selection marks on the panel of sealing frame glue to be cured.

Specifically, after coating photoresist on the mask layer material film, an ordinary mask plate is used to form the first mask layer pattern through exposure, developing and etching.

Wherein, as shown in FIG. 7, the step 102b of processing the mask layer material film through one patterning process, so as to form a first mask layer pattern may comprise the steps of:

102b1. Coating photoresist on a substrate on which a mask layer material film is formed.

Figure 8:
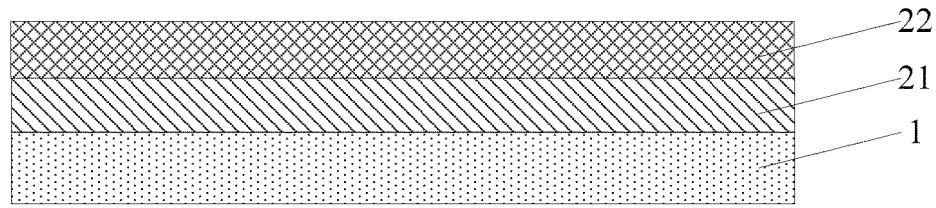
FIG. 8 is a schematic view of coating a layer of photoresist on the mask layer material film in the process of fabricating the UV curing mask plate as shown in FIG. 1.

Preferably, the method of magnetron sputtering is used to form the mask layer material film on the substrate, then a layer of photoresist is coated on the mask layer material film. As shown in FIG. 8, a layer of photoresist 22 is coated on the mask layer material film 21.

102b2. Exposing the photoresist using the mask plate, then developing the photoresist after exposure, forming a photoresist complete reservation area and a photoresist complete removal area after the development.

Wherein the photoresist complete reservation area corresponds to the areas of the alignment marks and selection marks, other areas are the photoresist complete removal area; Wherein the mask plate comprises: a full transparent part and a non-transparent part, the full transparent part corresponds to a full transparent area, the non-transparent part corresponds to a non-transparent area.

Figure 9:
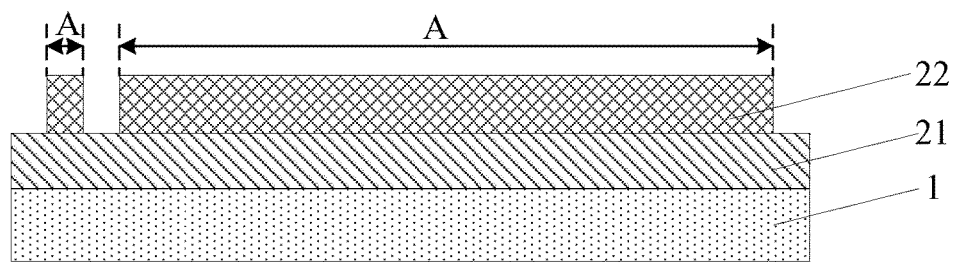
FIG. 9 is a schematic view of performing development to the photoresist in FIG. 8 in the process of fabricating the array substrate as shown in FIG. 1.

Specifically, as shown in FIG. 9, the photoresist complete reservation area is the area A as shown in FIG. 9; the thickness of the photoresist complete reservation part should be as uniform as possible, and is the initial thickness of the photoresist after being coated, the photoresist of other areas is removed completely.

102b3. Removing the mask layer material film located at the photoresist complete removal area.

Specifically, the area of the mask layer material film 21 not covered by the photoresist can be etched using etching solution, the mask layer material film is formed as the first mask layer pattern.

102c. Processing the first mask layer pattern, so as to form a mask layer pattern corresponding to the area not covered by the sealing frame glue to be cured.

Wherein, as shown in FIG. 7, 102c of processing the first mask layer pattern, so as to form a mask layer pattern corresponding to the area not covered by the sealing frame glue to be cured may comprise step 102c1 or steps 102c2~102c3, the step 102c1 or the steps 102c2~102c3 may be performed based on specific implementing solutions;

102c1. Processing the first mask layer pattern through laser scanning process using a laser scanning device, so as to form a mask layer pattern corresponding to the area not covered by the sealing frame glue to be cured.

Specifically, the first mask layer pattern is scanned using the laser scanning device, the photoresist and the mask layer material to which the area not covered by the sealing frame glue to be cured in the first mask layer pattern corresponds are removed, meanwhile, the photoresist in the first mask layer pattern is etched using the laser scanning device, to obtain the mask layer pattern as shown in FIG. 1.

102c2. Processing the first mask layer pattern using the mask plate so as to form an UV pattern fabricating area.

Wherein the UV pattern fabricating area is an area that corresponds to the film where the sealing frame glue layer to be cure locates and on which the pattern of the sealing frame glue curing mask plate needs to be fabricated.

102c3. Processing the UV pattern fabricating area through laser scanning process using a laser scanning device, so as to form a mask layer pattern corresponding to the area not covered by the sealing frame glue to be cured.

Specifically, when the alignment marks are on the same line as the sealing frame glue, firstly, the mask plate is used to shield the metal materials of the alignment sign area and the selection area in the first mask layer pattern that has been formed to form an UV pattern fabricating area, then the metal material of the area not covered by the sealing frame glue in the UV pattern fabricating area and the photoresist in the first mask layer pattern are removed using the laser scanning device, to obtain the mask layer pattern as shown in FIG. 2.

The method of fabricating an UV curing mask plate in the embodiment of this disclosure only needs to perform filing, exposure, developing and etching processes once to form an UV curing mask plate required in sealing frame glue curing, which reduces the process flow greatly and has great advantages and a relatively great market value relative to the method of fabricating an UV curing mask plate in the prior art that needs to perform filming exposure, developing and etching processes many times.

The method of fabricating an UV curing mask plate provided in the embodiment of this disclosure forms a mask layer pattern on the substrate, and the material of the mask layer is a material with the function of blocking UV light, thereby, in the sealing frame glue curing process, this fabricating method only needs to perform filming, exposure and etching processes once to form the UV curing mask plate, it solves the problem that the fabrication of the UV mask plate used in the existing sealing frame glue curing process needs to perform filming, exposure and etching processes many times, which reduces the production cost, reduces the process flow, and reduces the complexity. Thereby, it can save time and improve production efficiency.

The embodiment of this disclosure provides a display device, the film to be cured in the display device is cured using an UV curing mask plate provided by any one of the above embodiments, the display device may be: any product or component with the display function such as a mobile phone, a panel computer, a television, a laptop, a digital photo frame, a navigator.

The display device provided by the embodiment of this disclosure forms a mask layer pattern on the substrate by using a patterning process, meanwhile, the formed UV curing mask plate only comprises a substrate and a mask layer, and the material of the mask layer is a material with the function of blocking UV light, in this way, the fabrication of the UV curing mask plate only needs to perform filming, exposure and etching processes once, using this UV curing mask plate to cure the film to be cured in the display device solves the problem that the fabrication of the UV mask plate used in the existing sealing frame glue curing process needs to perform filming, exposure and etching processes many times, which reduces the production cost, reduces the process flow, and reduces the complexity. Thereby, it can save time and improve production efficiency.

What are stated above are only specific implementing modes of this disclosure, however, the protection scope of this disclosure is not limited to this, any modifications or replacements that the skilled person familiar with the present technical field can easily think of within the technical scope disclosed by this disclosure should be covered within the protection scope of this disclosure. Therefore, the protection scope of this disclosure should be based on the protection scopes of the claims.

The invention claimed is:

1. A UV curing mask plate, comprising a substrate and a mask layer on the substrate,
    wherein the mask layer comprises a UV light blocking material,
    wherein the mask layer comprises four first sub-patterns which are arranged on four corners of the substrate and act as mask alignment marks, and a plurality of second sub-patterns which are arranged on the substrate in areas not covered by a film to be cured;
    wherein a line between any two neighboring first sub-patterns does not overlap the plurality of second sub-patterns; and
    wherein the plurality of second sub-patterns comprise a first group of sub-patterns which are arranged within a region defined by lines between two neighboring first sub-patterns, and a second group of sub-patterns which are arranged between the region and a periphery of the substrate.

2. The UV curing mask plate according to claim 1, wherein
    the mask layer comprises a metal material.

3. The UV curing mask plate according to claim 2, wherein
    the metal material comprises at least one of molybdenum, aluminum, copper and tungsten.

4. The UV curing mask plate according to claim 3, wherein a thickness of the mask layer is 2000~4000 Å.

5. The UV curing mask plate according to claim 2, wherein a thickness of the mask layer is 2000~4000 Å.

6. The UV curing mask plate according to claim 1, wherein a thickness of the mask layer is 2000~4000 Å.

7. A display device, wherein the film to be cured in the display device is cured using the UV curing mask plate according to claim 1.

8. The display device according to claim 7, wherein the mask layer comprises a metal material.

9. The display device according to claim 8, wherein the metal material comprises: at least one of molybdenum, aluminum, copper, tungsten.

10. The display device according to claim 7, wherein a thickness of the mask layer is 2000~4000 Å.

11. The display device according to claim 7, wherein the film to be cured is a sealing frame glue.

12. The UV curing mask plate according to claim 1, wherein the mask layer further comprises a third sub-pattern which is arranged on one of the corners of the substrate and acts as a selection mark.

13. A method of fabricating a UV curing mask plate, wherein the method comprises:
    providing a substrate;
    forming a mask layer on the substrate through one patterning process;
    wherein the mask layer comprises a UV light blocking material,
    wherein the mask layer comprises four first sub-patterns which are arranged on four corners of the substrate and act as mask alignment marks, and a plurality of second sub-patterns which are arranged on the substrate in areas not covered by a film to be cured, wherein a line between any two neighboring first sub-patterns does not overlap the plurality of second sub-patterns, and wherein the plurality of second sub-patterns comprise a first group of sub-patterns which are arranged within a region defined by lines between two neighboring first sub-patterns, and a second group of sub-patterns which are arranged between the region and a periphery of the substrate.

14. The method according to claim 13, wherein the mask layer further comprises a third sub-pattern which is arranged on one of the corners of the substrate and acts as a selection mark, and said forming the mask layer on the substrate through one patterning process comprises:

forming a mask layer material film on the substrate;

processing the mask layer material film through one patterning process to form a mask layer pattern; wherein the mask layer pattern comprises the first sub-patterns and the third sub-pattern; and processing the mask layer pattern to further form the second sub-patterns.

15. The method according to claim 14, wherein said processing the mask layer material film through one patterning process to form the mask layer pattern comprises:

coating photoresist on the substrate on which the mask layer material film is formed;

exposing the photoresist using a mask plate, then developing the exposed photoresist, forming a photoresist complete reservation area and a photoresist complete removal area after the development; wherein the photoresist complete reservation area corresponds to the areas of the first sub-patterns and the third sub-pattern, and other areas are the photoresist complete removal area;

removing the mask layer material film located in the photoresist complete removal area.

16. The method according to claim 14, wherein said processing the mask layer pattern to further form the second sub-patterns comprises:

processing the mask layer pattern through a laser scanning process using a laser scanning device, to form the second sub-patterns.

17. The method according to claim 14, wherein said processing the mask layer pattern to further form the second sub-patterns comprises:

processing the mask layer pattern using the mask plate so as to form a UV pattern fabricating area; and processing the UV pattern fabricating area through a laser scanning process using a laser scanning device, to form the second sub-patterns.

* * * * *